(12) United States Patent
Hino

(10) Patent No.: US 6,206,507 B1
(45) Date of Patent: Mar. 27, 2001

(54) PRINTER

(75) Inventor: Motohito Hino, Nagoya (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 0 days.

(21) Appl. No.: 09/188,168

(22) Filed: Nov. 9, 1998

(30) Foreign Application Priority Data

Dec. 4, 1997 (JP) .................................................. 9-334476

(51) Int. Cl.$^7$ .................................................. B41J 2/14
(52) U.S. Cl. .................................................. 347/50
(58) Field of Search ............................... 347/50; 439/67, 439/77, 498

(56) References Cited

U.S. PATENT DOCUMENTS 3,727,168 * 4/1973 Heschen et al. ....................... 339/17
5,482,473 * 1/1996 Lord et al. ............................. 439/67

* cited by examiner

Primary Examiner—N. Le
Assistant Examiner—Michael Nghiem
(74) Attorney, Agent, or Firm—Oliff & Berridge, PLC

(57) ABSTRACT

A recording head of a printer and its driving circuit are electrically connected via a flexible printed circuit that is provided with electrodes in pitch corresponding to the nozzles of the recording head and a general purpose flexible printed circuit. Thus, the manufacturing cost is reduced. In addition, the connection of both flexible printed circuits is prevented from being dirtied, and the handling during manufacturing is facilitated.

27 Claims, 8 Drawing Sheets

PRINTER

BACKGROUND OF THE INVENTION

1. Field of the Invention

The invention relates to a printer. In particular, the invention relates to an actuator in a recording device, and connecting the actuator to a driving circuit via a flexible printed circuit.

2. Description of Prior Art

Conventionally, in a printer for recording an image on a recording medium, a printed circuit board that drives a recording head (an actuator) is disposed far from a nozzle of the printer. This avoids staining the printed circuit board with superfluous ink, such as ink mist that is generated when ink is jetted from the ink jetting nozzle during recording. The recording head and the driving printed circuit board are electrically connected via a flexible printed circuit.

FIG. 8 shows an example of a head unit of the printer. FIG. 8 is an exploded perspective view showing the head unit. A head unit 100 is provided with a recording head 2 that records according to an ink-jet method, a head holder 3 on which the recording head 2 is fixed, a head guide 4 that protects the recording head 2, a case holder 6 that protects an ink cartridge 5, in which ink is filled, and a printed circuit board 7 that drives the recording head 2, and a manifold 8 that supplies ink from the ink cartridge 5 to the recording head 2. Seal rubber 10 is attached to an end of the manifold 8. A flexible printed circuit 21, provided with electrodes in pitch corresponding to the nozzles of the recording head 2, is connected to the recording head 2. The recording head 2 and the printed circuit board 7 are electrically connected by connecting the flexible printed circuit 21 to the recording head 2 and to a connector 7B of the printed circuit board 7, which is disposed at an opposite side of the head holder 3 from the recording head 2.

Further, as shown in FIG. 9 in detail, the flexible printed circuit 21 is formed so that one end is provided with a characteristic electrode pitch which corresponds to the nozzles of the recording head 2, and the other end is provided with an electrode pitch which is suitable for connecting to the connector 7B of the printed circuit board 7.

However, this conventional structure is subject to the problem that, since the flexible printed circuit 21 must be manufactured so that the one end is provided with the characteristic electrode pitch corresponding to the nozzles of the recording head 2, the manufacturing cost of the flexible printed circuit 21 is comparatively high, and thus the manufacturing cost of the printer is comparatively high. The flexible printed circuit 21 is long because it is connected to the printed circuit board 7, which is disposed far from the nozzles of the recording head 2. The handling of the flexible printed during its manufacture, and the handling of the recording head 2 after the flexible printed circuit is attached, are difficult. It is also difficult to automate the manufacture. Therefore, the manufacturing cost is comparatively high.

It has been proposed to reduce the manufacturing cost of a printer by electrically connecting a recording head and its driving circuit via a flexible printed circuit that is provided with electrodes in pitch corresponding to the nozzles of the recording head, and a general purpose flexible printed circuit.

However, since electrodes of the flexible printed circuit that are in pitch corresponding to the nozzles of the recording head and the general purpose flexible printed circuit may be exposed, the problem arises that superfluous ink that is generated when the printer is operated, as well as various cleaning solvents and other materials used during manufacturing, adhere to the exposed electrodes. The connection is dirtied by the ink and other materials, and the connection fails.

SUMMARY OF THE INVENTION

The invention solves the above problems, and its object is to provide a printer, wherein the manufacturing cost of the printer is reduced by electrically connecting a recording head and its driving circuit via a flexible printed circuit that is provided with electrodes in pitch corresponding to the nozzles of the recording head and a general purpose flexible printed circuit, while at the same time the connection of both flexible printed circuits is prevented from becoming dirty, and the manufacture is facilitated by facilitating the handling of the recording head and the flexible printed circuits during manufacturing.

To achieve this object, the printer according to the invention is provided with a recording device that records an image on a recording medium. The recording device is provided with an actuator that has multiple recording elements and a printed circuit board that drives the actuator. One end of a first flexible printed circuit is connected to the printed circuit board. One end of a second flexible printed circuit, that is provided with electrodes in pitch corresponding to the recording elements of the actuator, is connected to the actuator. The electrode pitch at the other end of the second flexible printed circuit is approximately similar to the electrode pitch of electrodes of the first flexible printed circuit. The electrodes at the other ends of both flexible printed circuits are connected, and the outer surface of the connection is coated with an insulating member.

According to the above structure, since the actuator and its driving circuit board are electrically connected via the first flexible printed circuit, one end of which is connected to the printed circuit board that drives the actuator, and the second flexible printed circuit, one end of which is provided with electrodes in pitch corresponding to the recording elements of the actuator and which is connected to the actuator, a comparatively low-priced general purpose flexible printed circuit can be used as the first flexible printed circuit, and connection between the actuator and the driving circuit board is realized at a low price.

Since the second flexible printed circuit is small, the handling of the flexible printed circuit itself and the recording head, to which the flexible printed circuit is attached, is simple, and automation during manufacturing is easy.

Since the outer surface of the connection of both flexible printed circuits is coated with an insulating member, and electrodes in the connection of both flexible printed circuits are prevented from being exposed, superfluous ink that is generated when the printer is operated, as well as various cleaning solvents and other materials used during manufacturing, never adhere to the electrodes, and the connection can be prevented from failing.

Also, the printer according to the invention is provided with two flexible printed circuits. Both flexible printed circuits are connected by overlapping the respective other ends of both flexible printed circuits and soldering the respective electrodes.

Since, in the above structure, both flexible printed circuits are connected by soldering them, the respective electrodes of both flexible printed circuits can be securely connected.

Also, the recording device according to the invention is provided with multiple recording element rows, and the flexible printed circuit is connected to each recording element row.

According to the above structure, the recording device that is provided with multiple recording element rows, and its driving circuit board, can be easily connected.

Also, in the printer according to the invention, laminated films that are provided with an adhesive layer on opposite inner sides can be used as an insulating member.

According to the above structure, the connection of the first flexible printed circuit and the second flexible printed circuit can be simply and securely coated with laminated films due to an adhesive layer provided on the inner side of the laminated films.

Also, the recording element of the actuator according to the invention is a nozzle for jetting ink. The actuator is provided with an element corresponding to each nozzle on the side in parallel with the nozzle row. The electrode pitch at one end of the second flexible printed circuit is approximately similar to the electrode pitch on the side of the actuator.

According to the above structure, since the actuator is provided with ink jetting nozzles and electrodes corresponding to the ink jetting nozzles, and the second flexible printed circuit, which is provided with an electrode pitch that is approximately similar to the electrode pitch of the recording elements of the actuator, is connected to the actuator, the actuator and the driving circuit board can be readily and securely connected electrically, even if the actuator is provided with multiple recording elements. Since the recording device complies with an ink-jet method, the whole structure can be miniaturized.

As described above, according to the printer of the invention, since the actuator and the driving circuit board are connected via the first flexible printed circuit and the second flexible printed circuit, which is provided with electrodes in pitch corresponding to the recording elements of the actuator and connected to the actuator, the amount that the second flexible printed circuit is used, which is high in cost, can be reduced, and the cost can be reduced by this amount. Since the second flexible printed circuit is small, the handling of the flexible printed circuit itself, and the recording head to which the flexible printed circuit is connected, is simple, the manufacture is easy, and the cost can be also reduced as discussed above. Since the outer surface of the connection of both flexible printed circuits is coated with an insulating member, the electrodes in the connection of both flexible printed circuits are prevented from being exposed. Thus, superfluous ink that is generated when the printer is operated, as well as cleaning solvents and other materials that are used in manufacturing, are prevented from adhering to the electrodes, and the connection can be prevented from failing.

Also, according to the printer of the invention, since both flexible printed circuits are connected by soldering, the respective electrodes of both flexible printed circuits can be securely connected.

Also, according to the printer of the invention, since a flexible printed circuit is respectively connected to multiple recording element rows of the recording device, even an actuator that has multiple recording element rows can be readily and securely connected electrically to the driving circuit board.

Also, according to the printer of the invention, laminated films can be readily and securely bonded to the connection of the first flexible printed circuit and the second flexible printed circuit due to an adhesive layer provided on the inner side of the laminated films.

Also, according to the printer of the invention, since the actuator is provided with ink jetting nozzles and electrodes corresponding to the ink jetting nozzles, and the second flexible printed circuit, which is provided with an electrode pitch that is approximately similar to the electrode pitch of the recording elements of the actuator, is connected to the actuator, the actuator and the driving circuit board can be readily and securely connected electrically even if the actuator is provided with multiple recording elements. Further, since the structure of the recording device can be facilitated due to an ink-jet method, the entire printer can be miniaturized.

BRIEF DESCRIPTION OF THE DRAWINGS

A preferred embodiment of the invention will be described in detail with reference to the following figures, wherein.

DETAILED DESCRIPTION OF THE PREFERRED EMBODIMENT

Figure 1:
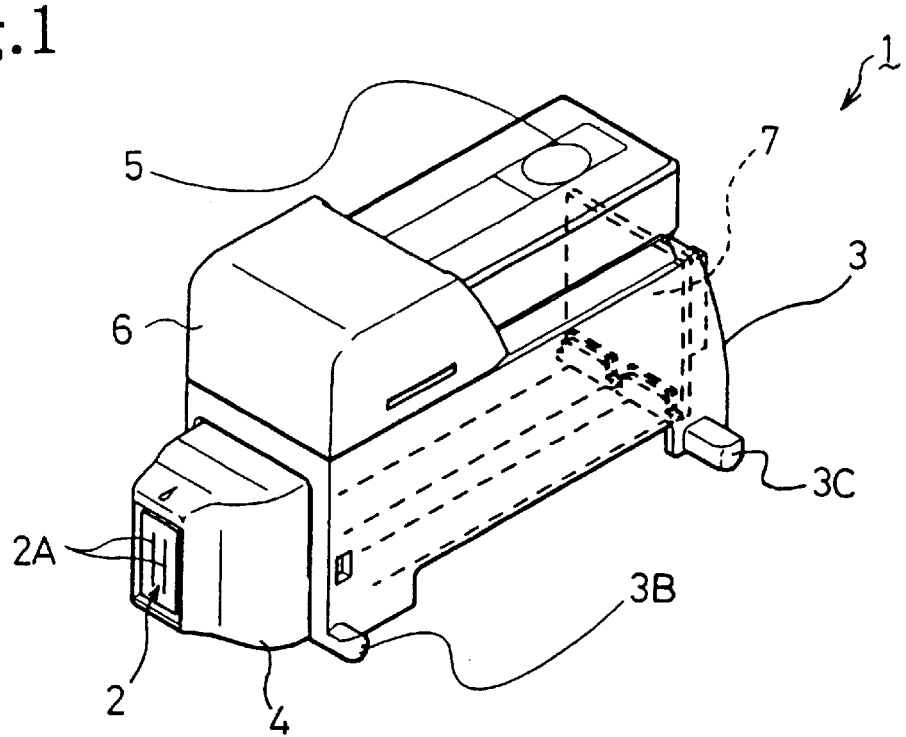
FIG. 1 is a perspective view showing a head unit of a printer in accordance with an embodiment of the invention.
Figure 2:
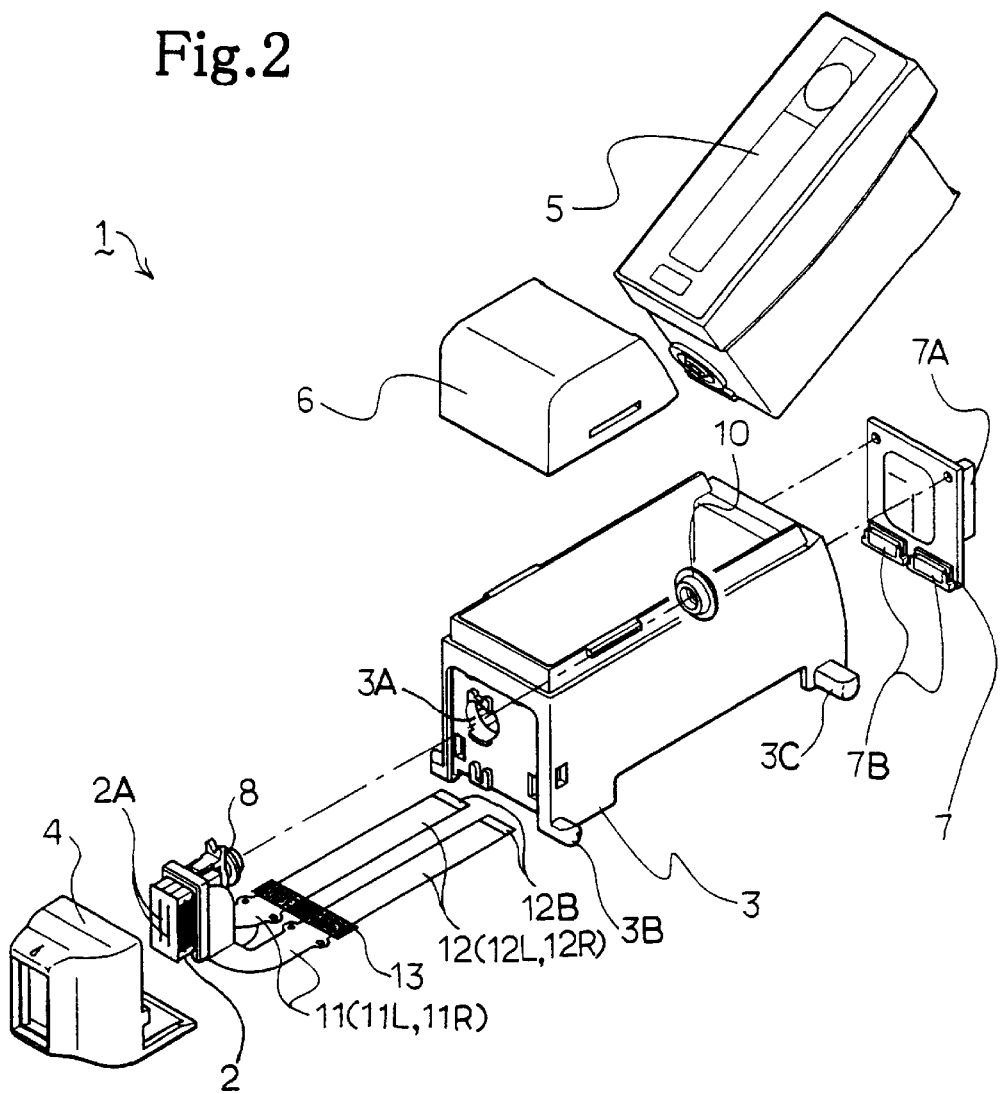
FIG. 2 is an exploded perspective view showing the head unit of FIG. 1.

Referring to the drawings, a printer in accordance with an embodiment of the invention will be described below. FIG. 1 is a perspective view showing a head unit of the printer in accordance with the embodiment of the invention, and FIG. 2 is an exploded perspective view showing the head unit. The head unit (recording device) 1 includes a recording head (an actuator) 2 that records according to an ink-jet system, a head holder 3 to which the recording head 2 is fixed, a head guide 4 that protects the recording head 2, a case holder 6 that protects an ink cartridge 5 in which ink is filled, and a printed circuit board (recording device) 7 that drives the recording head 2. Protruded parts 3B and 3C, for positioning when mounted on a carriage (not shown), are provided to the head holder 3, and a connector 7A that connects to a main printed circuit is provided to the printed circuit 7.

A manifold 8, for supplying ink from the ink cartridge 5, is provided to the recording head 2, and is fitted into the open part 3A of the head holder 3. Seal rubber 10 is attached to the end of the manifold 8 that is fitted into the open part 3A from the inside of the head holder 3. An ink cartridge 5, mounted on the head holder 3, and the recording head 2, are connected via the seal rubber 10, and ink in the ink cartridge 5 is supplied to the recording head 2 via the manifold 8.

Two nozzle rows 2A, each of which includes multiple nozzles (recording elements) for jetting ink that are arranged in a row, are provided to the recording head 2, and the recording head 2 is electrically connected to a printed circuit board 7 via flexible printing circuits (second flexible printed circuits) 11L and 11R (referenced together as 11) that are provided at one end with electrodes in pitch corresponding to the pitch of electrodes (the details are described later) that are provided to correspond to respective nozzles of each nozzle row, and general purpose flexible printed circuits (first flexible printed circuits) 12L and 12R (referenced together as 12). At the end of the flexible printed circuit 11 in that is connected to the general purpose flexible printed circuit 12, electrodes are provided in pitch approximately similar to the electrode pitch of the general purpose flexible printed circuit 12, and the respective electrodes at the respective ends of both flexible printed circuits are connected by soldering. The outer surface of the connection is coated with laminated films (an insulating member) 13. The details of soldering the connection and coating with laminated films will be described later. A connection 12B, that connects to the connector 7B of the printed circuit board 7, is provided at the end of the general purpose flexible printed circuit 12 on the side of the printed circuit board 7.

Figure 3:
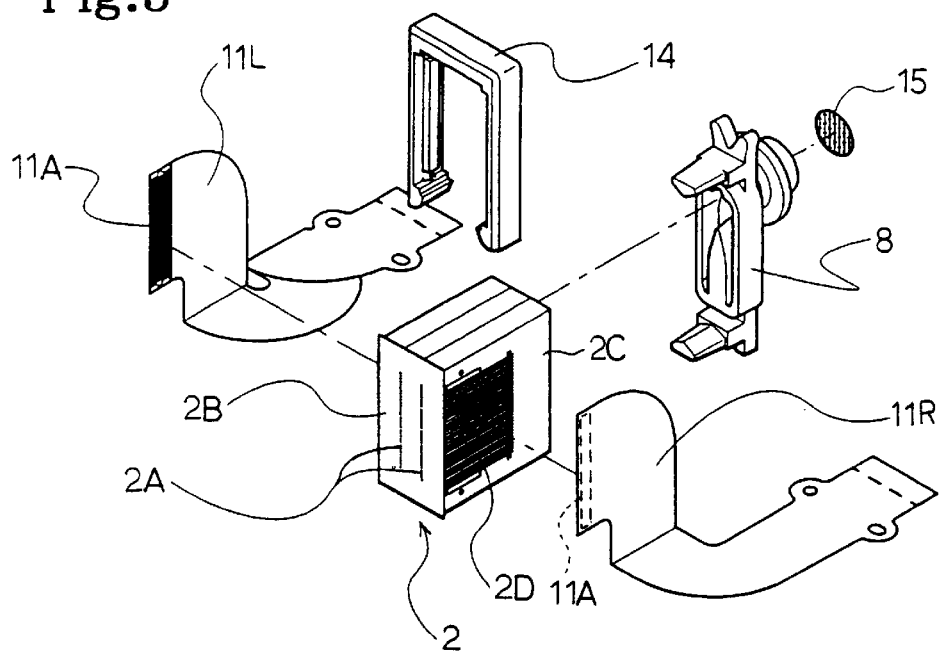
FIG. 3 is an exploded perspective view showing a recording head.

Further, referring to FIG. 3, the recording head 2 will be described in detail. FIG. 3 is an exploded perspective view showing the recording head 2. In the recording head 2, two nozzle rows 2A are provided in a nozzle plate 2B that is disposed opposite to a recording medium. Multiple electrodes 2D are respectively provided at both right and left sides 2C parallel with the nozzle rows 2A. The electrodes 2D apply a driving signal to each ink jetting device corresponding to each nozzle in the nozzle rows 2A. As described above, electrodes 11A that are provided with a pitch approximately similar to the pitch of the electrodes 2D of the recording head 2 are respectively provided at one end of the flexible printed circuit 11. These electrodes 11A are connected to the electrodes 2D of the recording head 2 by soldering. A filter 15, for removing foreign matter that is included in ink supplied from the ink cartridge 5 to the recording head 2, is provided at the end of the manifold 8.

Figure 4:
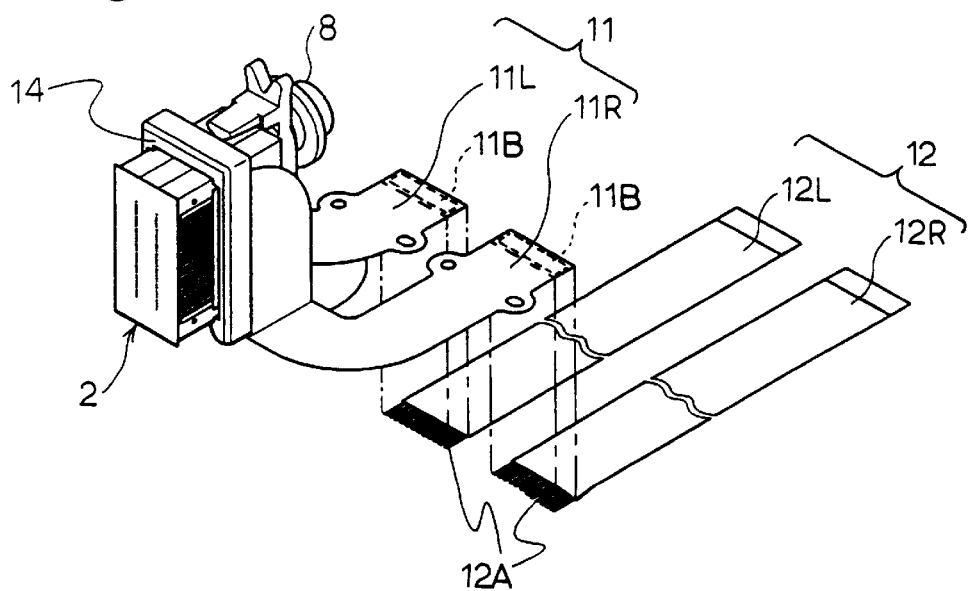
FIG. 4 is a perspective view showing a recording head, a flexible printed circuit and a general purpose flexible printed circuit in a state before the flexible printed circuit and the general purpose flexible printed circuit are connected.
Figure 5:
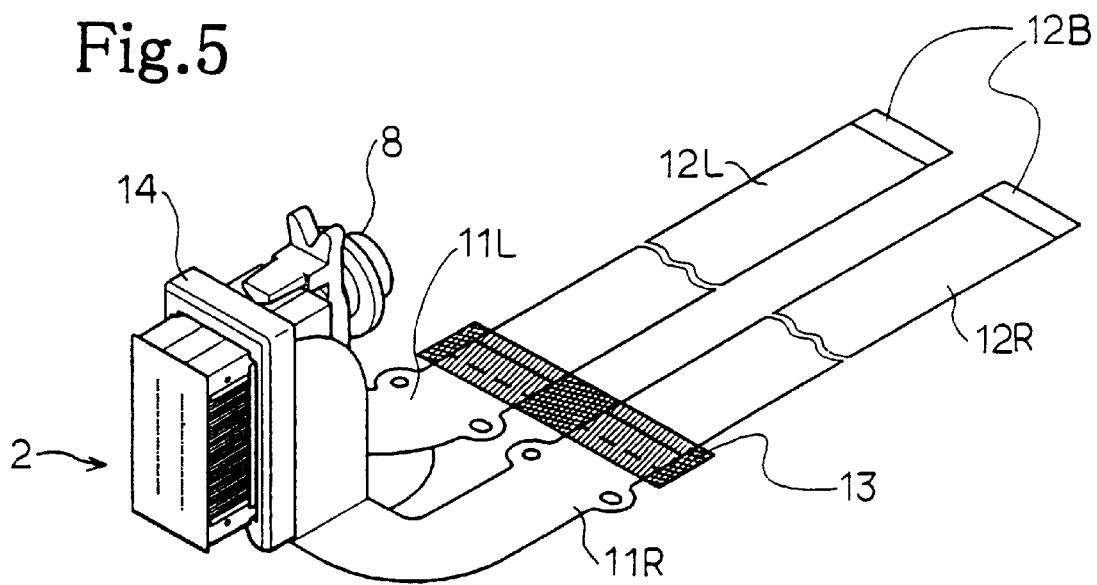
FIG. 5 is a perspective view showing the recording head, the flexible printed circuit and the general purpose flexible printed circuit in a state in which the connection of the flexible printed circuit and the general purpose flexible printed circuit is coated with laminated films.

Next, referring to FIGS. 4 and 5, connecting the flexible printed circuit 11 and the general purpose flexible printed circuit 12 will be described. The flexible printed circuit 11 and the general purpose flexible printed circuit 12 are connected immediately before a test of the recording head 2 is finished and the recording head is assembled into the head holder 3. FIG. 4 is a perspective view showing the recording head 2, the flexible printed circuit 11, and the general purpose flexible printed circuit 12, before the flexible printed circuit 11 and the general purpose flexible printed circuit 12 are connected. FIG. 5 is a perspective view showing the recording head 2, the flexible printed circuit 11 and the general purpose flexible printed circuit 12 when the connection of the flexible printed circuit 11 and the general purpose flexible printed circuit 12 is coated with laminated films.

As described above, electrodes 11B provided at the other end of the flexible printed circuit 11, and electrodes 12A provided at one end of the general purpose flexible printed circuit 12, are connected by soldering, and the outer surface of the connection is coated with the laminated films 13. Since the pitch of the electrodes 2D corresponding to the nozzles of the recording head 2 is often pitch specific to the recording head, and is often different from the pitch of the electrodes 12A of the general purpose flexible printed circuit 12, the general purpose flexible printed circuit 12 can rarely be directly connected to the electrodes 2D of the recording head 2. Therefore, the flexible printed circuit 11 includes electrodes 11A having a pitch corresponding to the pitch of the electrodes 2D of the recording head 2 so that the flexible printed circuit 11 can be connected to the electrodes 2D of the recording head 2.

Figure 6:
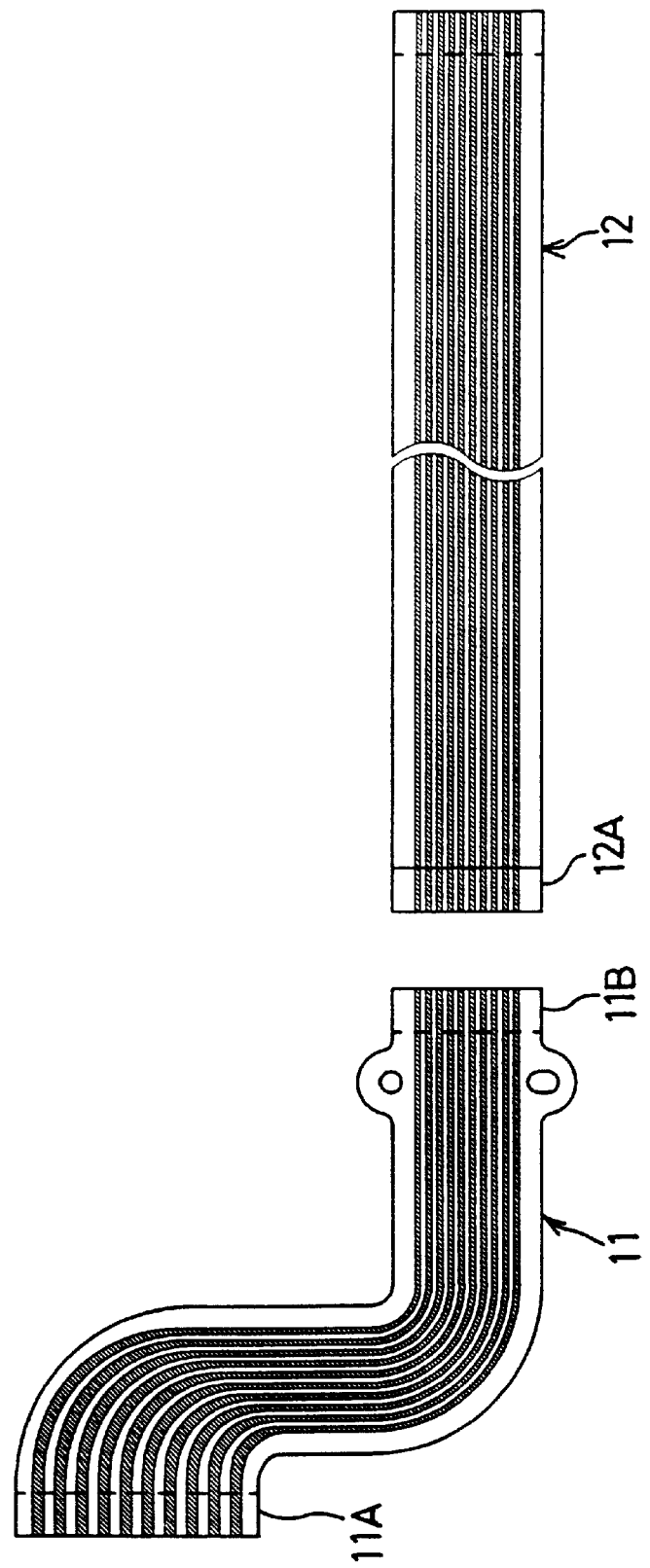
FIG. 6 is an explanatory drawing showing the structure of the flexible printed circuit and the general purpose flexible printed circuit.
Figure 7A:
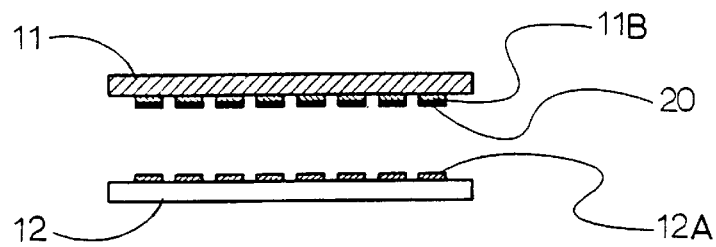
FIGS. 7(A) to 7(D) are sectional views showing the connection of the flexible printed circuit and the general purpose flexible printed circuit, and a state in which they are coated with the laminated films.
Figure 7B:
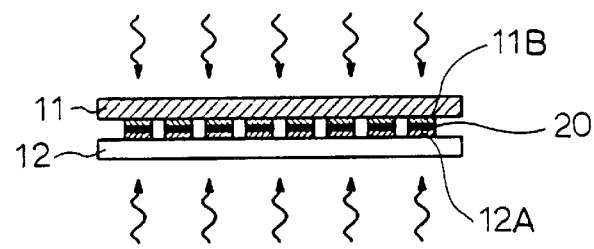
Figure 7C:
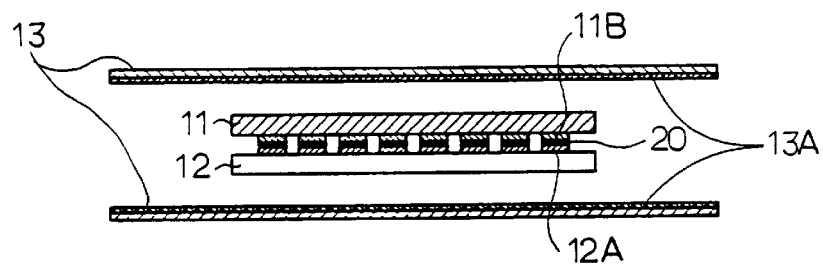
Figure 7D:
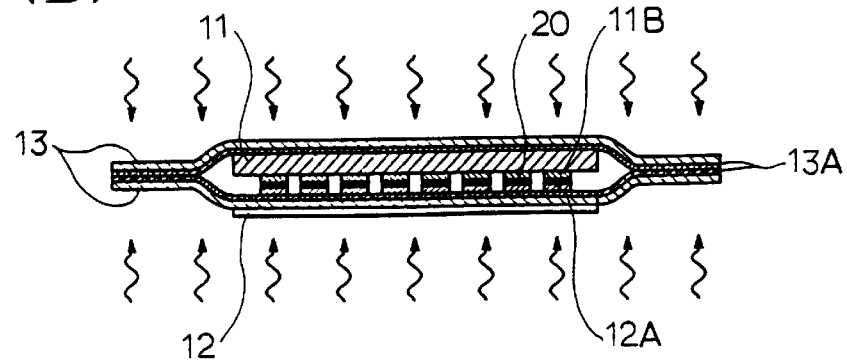
Figure 8:
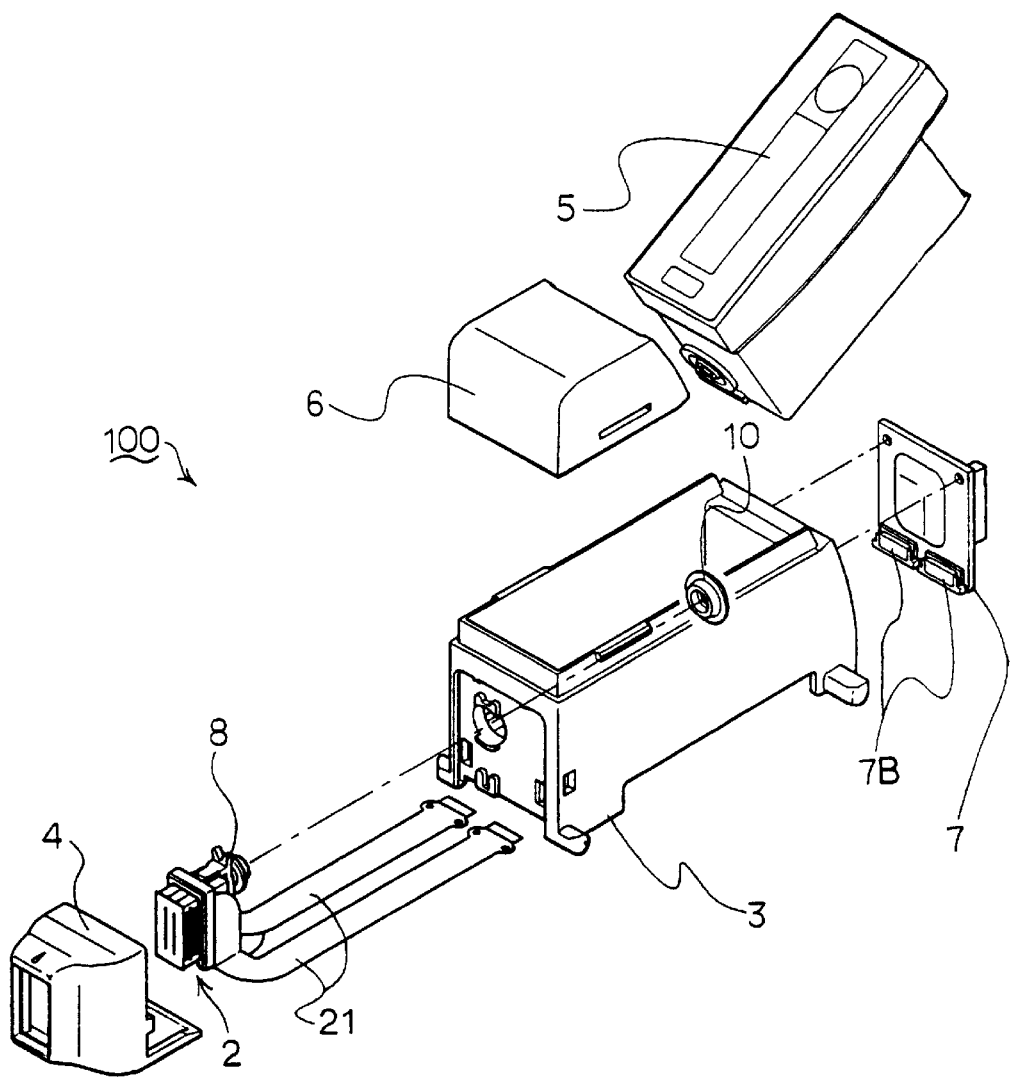
FIG. 8 is an exploded perspective view showing a head unit of a conventional printer.
Figure 9:
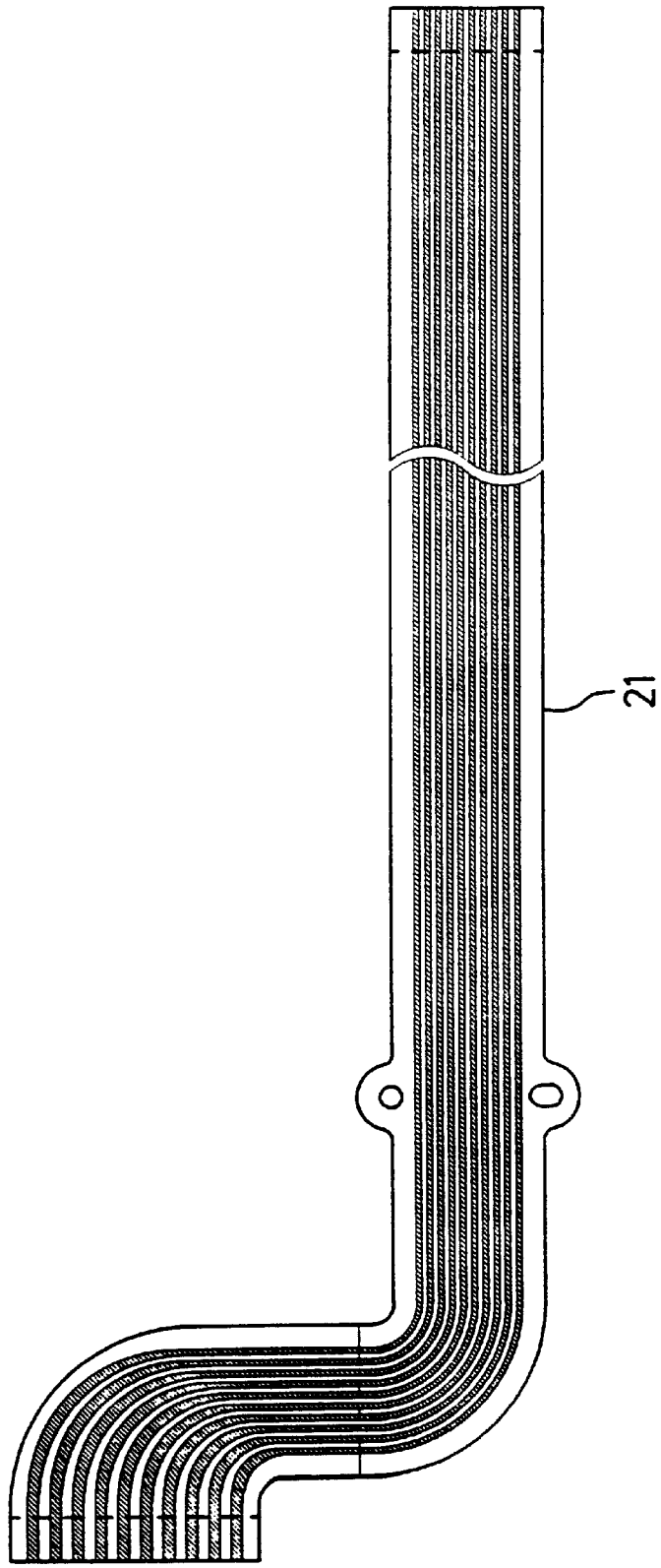
FIG. 9 is an explanatory drawing showing the structure of a conventional flexible printed circuit.

FIG. 6 shows, in detail, an example of the concrete structure of the flexible printed circuit 11 which can be connected to the electrodes 2D that have a specific pitch corresponding to the nozzles of the recording head 2 and the electrodes 12A of the general purpose flexible printed circuit 12. Since the manufacturing cost of such a specific flexible printed circuit 11 is high, the flexible printed circuit 11 is a small part, and the general purpose flexible printed circuit 12, which is low in cost, is a large part.

Next, referring to FIGS. 7(A)–7(D), connecting the flexible printed circuit 11 and the general purpose flexible printed circuit 12, and coating the connection with laminated films, will be described. FIGS. 7(A) to 7(D) are sectional views showing a state in which the flexible printed circuit 11 and the general purpose flexible printed circuit 12 are connected, and the connection is coated with laminated films. When the flexible printed circuit 11 and the general purpose flexible printed circuit 12 are connected, first, the electrodes 11B of the flexible printed circuit 11 are plated with solder. The solder plating 20 is melted by positioning, overlapping and heating the respective electrodes of the flexible printed circuit 11 and the general purpose flexible printed circuit 12, so that they are soldered.

Next, both sides of the overlapped flexible printed circuit 11 and general purpose flexible printed circuit 12 are coated with two laminated films 13 to the opposite inner sides of which the adhesive layer 13A is applied. The laminated films 13 are formed by applying a polyethylene adhesive inside polyester films, for example. The thickness of the polyester films and the adhesive layer is approximately 0.1 mm in total. Afterward, the adhesive layer 13A is melted by heating the flexible printed circuit 11 and the general purpose flexible printed circuit 12, respectively coated with the laminated films 13, and laminating is performed. Generally, in laminating, the flexible printed circuit 11 and the general purpose flexible printed circuit 12 are placed between rollers and pressurized. Thus, the connection of the flexible printed circuit 11 and the general purpose flexible printed circuit 12 is shielded from the ambient environment by the laminated films 13 and sealed. The temperature when the adhesive layer 13A melts is approximately 100 to 120° C., which is low enough below the temperature for melting solder plating 20. Thus, a previously soldered part is never melted again, and the connection between the respective electrodes never fails.

As described above, according to the printer of this embodiment, as the recording head 2 and the printed circuit board 7 are connected via the flexible printed circuit 11 and the general purpose flexible printed circuit 12, the amount that the flexible printed circuit 11 is used, which is high in cost, can be reduced, and the cost of the printer can be reduced by this reduced amount. Since the flexible printed circuit 11 is small, the flexible printed circuit 11 itself, and the recording head 2 to which the flexible printed circuit 11 is connected, can be handled easily, and automation during manufacturing is easy. Since the connection of the flexible printed circuit 11 and the general purpose flexible printed circuit 12 is coated with the laminated films 13, the connection is shielded from the ambient environment, can be protected from contamination by ink and other materials, the printing operation is prevented from failing, and other types of problems can be prevented. Even though one flexible printed circuit can be readily peeled off by pulling it if the flexible printed circuits are only soldered, the physical strength of the connection can be increased because the connection is coated with the laminated films.

The invention may be changed without being limited to the structure of the above embodiment. For example, in the above embodiment, the connection of the flexible printed circuit 11 and the general purpose flexible printed circuit 12 is coated with the laminated films 13. However, the invention is not limited to this structure, and the connection may also be coated with another insulating sheet member and liquid resin. If laminated films are used, the cost is lower than if resin is used. Work for wiring can be facilitated without damaging the character of the flexible printed circuits 11 and 12 by using flexible material as laminated films and an insulating sheet member desirably.

Multiple nozzle rows 2A are provided in the recording head 2, and the respective electrodes corresponding to these nozzle rows 2A are connected to the printed circuit board 7 via the flexible printed circuit 11 and the general purpose flexible printed circuit 12. However, one nozzle row can be provided in the recording head 2, and electrodes corresponding in the one nozzle row may also be connected to the printed circuit board 7.

In the above embodiment, the printer according to the invention is an ink-jet printer. However, the printer according to the invention may also comply with another recording method, such as a thermal imprint recording method.

What is claimed is:

1. A printer for recording an image on a recording medium, comprising:
    an actuator having at least one recording element;
    a printed circuit board that drives the actuator, the printed circuit board having a connector;
    a first flexible printed circuit having electrodes at one end and at another end, the electrodes at the one end having a pitch corresponding to the connector of the printed circuit board;
    a second flexible printed circuit having electrodes at one end and at another end, the electrodes at the one end having a pitch corresponding to the at least one recording element of the actuator, the electrodes at the other end having a pitch approximately equal to a pitch of the electrodes at the other end of the first flexible printed circuit; and
    a connection that connects the electrodes at each of the other ends of the first flexible printed circuit and the second flexible printed circuit.

2. The printer according to claim 1, wherein said first flexible printed circuit and said second flexible printed circuit are connected by overlapping the other ends of the first flexible printed circuit and the second flexible printed circuit, and soldering the electrodes.

3. The printer according to claim 1, wherein the insulating member includes laminated films that are each provided with an adhesive layer on opposite inner sides.

4. The printer according to claim 3, wherein said laminated films are formed by applying a polyethylene adhesive to polyester resin, which functions as a base.

5. The printer according to claim 1, wherein said actuator includes multiple recording element rows, and said second flexible printed circuit is connected to each recording element row of the multiple recording element rows.

6. The printer according to claim 1, wherein the at least one recording element of said actuator includes multiple nozzles arranged in rows that jet ink, said actuator is provided with an electrode corresponding to each nozzle on a side of the recording element that is parallel to a nozzle row of the nozzle to which the electrode corresponds, and the pitch of electrodes at the one end of said second flexible printed circuit is approximately equal to the pitch of the electrodes on the side of the recording element.

7. The printer according to claim 1, wherein the pitch of the electrodes at the one end of the second flexible printed circuit is different than the pitch of the electrodes at the other end of the second flexible printed circuit.

8. The printer according to claim 1, wherein the pitch of the electrodes at the one end of the first flexible printed circuit is the same as the pitch of the electrodes at the other end of the first flexible printed circuit.

9. The printer according to claim 1, further including an insulating member that coats the outer surface of the connection.

10. A printer for recording an image on a recording medium, comprising:
    an actuator having at least one recording element;
    a printed circuit board that drives the actuator, the printed circuit board having a connector;
    a first flexible printed circuit having electrodes at one end and at another end, the electrodes at the one end having a pitch corresponding to the connector of the printed circuit board;
    a second flexible printed circuit having electrodes at one end and at another end, the electrodes at the one end having a pitch corresponding to the at least one recording element of the actuator, the electrodes at the other end having a pitch approximately equal to a pitch of the electrodes at the other end of the first flexible printed circuit; and
    means for connecting the electrodes at each of the other ends of the first flexible printed circuit and the second flexible circuit.

11. The printer according to claim 10, wherein said first flexible printed circuit and said second flexible printed circuit are connected by overlapping the other ends of the first flexible printed circuit and the second flexible printed circuit, and soldering the electrodes.

12. The printer according to claim 10, wherein the means for insulating includes laminated films that are each provided with an adhesive layer on opposite inner sides.

13. The printer according to claim 12, wherein said laminated films are formed by applying a polyethylene adhesive to polyester resin, which functions as a base.

14. The printer according to claim 10, wherein said actuator includes multiple recording element rows, and said second flexible printed circuit is connected to each recording element row of the multiple recording element rows.

15. The printer according to claim 10, wherein the at least one recording element of said actuator includes multiple nozzles arranged in rows that jet ink, said actuator is provided with an electrode corresponding to each nozzle on a side of the recording element that is parallel to a nozzle row of the nozzle to which the electrode corresponds, and the pitch of electrodes at the one end of said second flexible printed circuit is approximately equal to the pitch of the electrodes on the side of the recording element.

16. The printer according to claim 10, wherein the pitch of the electrodes at the one end of the second flexible printed circuit is different than the pitch of the electrodes at the other end of the second flexible printed circuit.

17. The printer according to claim 16, wherein the pitch of the electrodes at the one end of the first flexible printed circuit is the same as the pitch of the electrodes at the other end of the first flexible printed circuit.

18. The printer according to claim 10, further including means for insulating the outer surface of the connection.

19. An ink jet print head assembly for use with a printer to record an image on a recording medium, comprising:
- an actuator having at least one recording element;
- a printed circuit board that drives the actuator, the printed circuit board having a connector;
- a first flexible printed circuit having electrodes at one end and at another end, the electrodes at the one end having a pitch corresponding to the connector of the printed circuit board;
- a second flexible printed circuit having electrodes at one end and at another end, the electrodes at the one end having a pitch corresponding to the at least one recording element of the actuator, the electrodes at the other end having a pitch approximately equal to a pitch of the electrodes at the other end of the first flexible printed circuit; and
- a connection that connects the electrodes at each of the other ends of the first flexible printed circuit and the second flexible printed circuit.

20. The ink jet print head assembly according to claim 19, wherein said first flexible printed circuit and said second flexible printed circuit are connected by overlapping the other ends of the first flexible printed circuit and the second flexible printed circuit, and soldering the electrodes.

21. The ink jet print head assembly according to claim 19, wherein the insulating member includes laminated films that are each provided with an adhesive layer on opposite inner sides.

22. The ink jet print head assembly according to claim 21, wherein said laminated films are formed by applying a polyethylene adhesive to polyester resin, which functions as a base.

23. The ink jet print head assembly according to claim 19, wherein said actuator includes multiple recording element rows, and said second flexible printed circuit is connected to each recording element row of the multiple recording element rows.

24. The ink jet print head assembly according to claim 19, wherein the at least one recording element of said actuator includes multiple nozzles arranged in rows that jet ink, said actuator is provided with an electrode corresponding to each nozzle on a side of the recording element that is parallel to a nozzle row of the nozzle to which the electrode corresponds, and the pitch of electrodes at the one end of said second flexible printed circuit is approximately equal to the pitch of the electrodes on the side of the recording element.

25. An ink jet print assembly for use with a printer to record an image on a recording medium, comprising:
- an actuator having at least one recording element;
- a printed circuit board that drives the actuator, the printed circuit board having a connector;
- a first flexible printed circuit having electrodes at one end and at another end, the electrodes at the one end having a pitch corresponding to the connector of the printed circuit board;
- a second flexible printed circuit having electrodes at one end and at another end, the electrodes at the one end having a pitch corresponding to the at least one recording element of the actuator, the electrodes at the other end having a pitch approximately equal to a pitch of the electrodes at the other end of the first flexible printed circuit; and
- a connection that connects the electrodes at each of the other ends of the first flexible printed circuit and the second flexible printed circuit,
- wherein the pitch of the electrodes at the one end of the second flexible printed circuit is different than the pitch of the electrodes at the other end of the second flexible printed circuit.

26. The ink jet print head assembly according to claim 25, wherein the pitch of the electrodes at the one end of the first flexible printed circuit is the same as the pitch of the electrodes at the other end of the first flexible printed circuit.

27. An ink jet print assembly for use with a printer to record an image on a recording medium, comprising:
- an actuator having at least one recording element;
- a printed circuit board that drives the actuator, the printed circuit board having a connector;
- a first flexible printed circuit having electrodes at one end and at another end, the electrodes at the one end having a pitch corresponding to the connector of the printed circuit board;
- a second flexible printed circuit having electrodes at one end and at another end, the electrodes at the one end having a pitch corresponding to the at least one recording element of the actuator, the electrodes at the other end having a pitch approximately equal to a pitch of the electrodes at the other end of the first flexible printed circuit; and
- a connection that connects the electrodes at each of the other ends of the first flexible printed circuit and the second flexible printed circuit,
- further including an insulating member that coats the outer surface of the connection.

* * * * *